(12) United States Patent
Saitou et al.

(10) Patent No.: US 9,752,815 B2
(45) Date of Patent: Sep. 5, 2017

(54) METHOD OF CONTROLLING HEAT SOURCE-SIDE HEAT EXCHANGER FAN, AND AIR CONDITIONER

(75) Inventors: Masashi Saitou, Sakai (JP); Junichi Shimoda, Sakai (JP); Tatsuya Makino, Sakai (JP)

(73) Assignee: Daikin Industries, Ltd., Osaka (JP)

( * ) Notice: Subject to any disclaimer, the term of this patent is extended or adjusted under 35 U.S.C. 154(b) by 1245 days.

(21) Appl. No.: 13/698,014

(22) PCT Filed: May 19, 2011

(86) PCT No.: PCT/JP2011/061544
§ 371 (c)(1),
(2), (4) Date: Nov. 14, 2012

(87) PCT Pub. No.: WO2011/148856
PCT Pub. Date: Dec. 1, 2011

(65) Prior Publication Data
US 2013/0061619 A1    Mar. 14, 2013

(30) Foreign Application Priority Data

May 24, 2010   (JP) .................. 2010-118691

(51) Int. Cl.
*F25D 17/04*  (2006.01)
*F25D 17/06*  (2006.01)
(Continued)

(52) U.S. Cl.
CPC .......... *F25D 17/06* (2013.01); *F24F 11/0012* (2013.01); *F24F 11/0079* (2013.01);
(Continued)

(58) Field of Classification Search
CPC ................... F25D 17/06; F25B 49/027; F25B 2313/02741; F24F 11/0012; F24F 2011/0043
See application file for complete search history.

(56) References Cited

U.S. PATENT DOCUMENTS 5,138,844 A * 8/1992 Clanin .................. F25B 49/027
62/180
2002/0011094 A1 * 1/2002 Cook .................. F02M 25/0809
73/49.2
(Continued)

FOREIGN PATENT DOCUMENTS

JP    4-98040 A    3/1992
JP    6-74575 A    3/1994
(Continued)

OTHER PUBLICATIONS

Kazuhiko et all, Refrigerating Cycle Device, Oct. 21, 2004, JP2004293870A, Whole Document.*
(Continued)

*Primary Examiner* — Larry Furdge
(74) *Attorney, Agent, or Firm* — Global IP Counselors, LLP

(57) ABSTRACT

A heat source-side heat exchanger fan blowing air to a heat source-side heat exchanger performing heat exchange with refrigerant compressed in a compressor is controlled. A current detected temperature at a current time is converted to obtain a current converted high pressure value at the current time. The current converted high pressure is a pressure of refrigerant inside a high pressure-side pipe of the compressor. The current detected temperature is a temperature detected by a temperature detector attached to the heat source-side heat exchanger. A past detected temperature is converted to obtain a past converted high pressure value at the past time. A speed of the heat source-side heat exchanger (Continued)

fan is determined using a corrected converted high pressure value. The corrected converted high pressure value is obtained by correcting the current converted high pressure value based on the past converted high pressure value.

4 Claims, 5 Drawing Sheets

(51) Int. Cl.
| | |
|---|---|
| *F24F 11/00* | (2006.01) |
| *F25B 49/02* | (2006.01) |
| *H05K 7/20* | (2006.01) |
| *F25B 13/00* | (2006.01) |

(52) U.S. Cl.
CPC ....... *F25B 49/027* (2013.01); *H05K 7/20836* (2013.01); *F24F 2011/0043* (2013.01); *F25B 13/00* (2013.01); *F25B 2313/0294* (2013.01); *F25B 2313/02741* (2013.01); *F25B 2313/0315* (2013.01); *F25B 2500/19* (2013.01); *F25B 2700/1931* (2013.01); *F25B 2700/2106* (2013.01); *Y02B 30/746* (2013.01)

(56) References Cited

U.S. PATENT DOCUMENTS

2006/0162355 A1* 7/2006 Nakayama ............ F25B 49/027
62/183

2008/0295530 A1   12/2008  Sawada et al.

FOREIGN PATENT DOCUMENTS

| JP | H10238395 A | * | 9/1998 |
|---|---|---|---|
| JP | 11-249491 A | | 9/1999 |
| JP | 2002-39598 A | | 2/2002 |
| JP | 3541788 B2 | | 4/2004 |
| JP | 2004293870 A | * | 10/2004 |
| JP | 2008-145036 A | | 6/2008 |
| JP | 2008-292112 A | | 12/2008 |
| JP | 2009-204208 A | | 9/2009 |
| WO | 2008/100255 A1 | | 8/2008 |

OTHER PUBLICATIONS

Kazuhide, Combustion Start Detecting Device for Internal Combustion Engine, Sep. 8, 1998, JPH10238395A, Whole Document.*
European Search Report of corresponding EP Applicatino No. 11 78 6555.0 dated Nov. 29, 2013.
International Preliminary Report of corresponding PCT Application No. PCT/JP2011/061544.
International Search Report of corresponding PCT Application No. PCT/JP2011/061544.

* cited by examiner

METHOD OF CONTROLLING HEAT SOURCE-SIDE HEAT EXCHANGER FAN, AND AIR CONDITIONER

CROSS-REFERENCE TO RELATED APPLICATIONS

This U.S. National stage application claims priority under 35 U.S.C. §119(a) to Japanese Patent Application No. 2010-118691, filed in Japan on May 24, 2010, the entire contents of which are hereby incorporated herein by reference.

TECHNICAL FIELD

The present invention relates to a method of controlling a heat source-side heat exchanger fan and to an air conditioner, and particularly to a method of controlling a heat source-side heat exchanger fan that blows air to a heat source-side heat exchanger and to an air conditioner to which the control method is applied.

BACKGROUND ART

In air conditioner installed in computer server rooms, for example, it is required that the air conditioner be managed at a constant temperature throughout the year even though there are heat sources such as servers, so a cooling operation is required even in a case where the outside air temperature is in a low outside air temperature region equal to or less than 20° C. In the cooling operation in a such a low outside air temperature region, the discharge pressure discharged from the compressor of the air conditioner becomes lower because the outdoor heat exchanger (heat source-side heat exchanger) is caused to function as a condenser, so it becomes difficult to secure the high-low pressure difference that is the difference between the discharge pressure (high pressure) and the suction pressure (low pressure). In order to secure the high-low pressure difference, as described in JP-A No. 2002-39598 for example, it is necessary to precisely control the outdoor fan for the outdoor heat exchanger of the air conditioner in accurate correspondence to the high-low pressure difference.

Consequently, in order to secure the high-low pressure difference in the cooling operation in the low outside air temperature region, detecting the discharge pressure and the suction pressure becomes important. It is common for the suction pressure, which is a low pressure, to be detected by a low-pressure pressure sensor, but methods of detecting the high-pressure discharge pressure include a method where a high-pressure pressure sensor is attached to a high pressure-side pipe of the compressor and a method where the discharge pressure is estimated from a thermistor attached to the outdoor heat exchanger.

If a high-pressure pressure sensor is used, the actual pressure inside the high pressure-side pipe of the compressor can be detected by the high-pressure pressure sensor, so it is possible to control the outdoor fan in accurate correspondence to the high-low pressure difference. However, compared to the case of using a thermistor, using a high-pressure pressure sensor not only becomes disadvantageous to miniaturizing the apparatus because the high-pressure pressure sensor cannot be attached unless a relatively wide space is ensured inside the machine chamber of the outdoor unit, but cost also becomes higher because the product itself is expensive. In addition, stress concentration in a particular place is triggered because the high-pressure pressure sensor becomes stood on the pipe, so a design that improves the strength of the pipe so as to withstand such stress concentration becomes necessary. For that reason, when the demand for space saving and cost reduction is strong, the method where the pressure of the refrigerant inside the high pressure-side pipe is estimated from the temperature of the refrigerant in the outdoor-side heat exchanger detected using a thermistor is employed.

SUMMARY

Technical Problem

However, when the high-pressure value is estimated from the thermistor, there are cases where a pressure detection delay resulting from a temperature detection delay in the thermistor occurs so that a delay occurs in the control of the outdoor fan. This delay in the control of the outdoor fan has the problems that it leads to hunting of the high-pressure value, ensuring the high-low pressure difference of the compressor becomes difficult, and the reliability of the compressor drops.

It is a problem of the present invention to provide a heat source-side heat exchanger fan control method which, in the control of an outdoor fan performed on the basis of an estimation of a high-pressure value by temperature detection, can ensure the reliability of a compressor by performing the estimation of the high-pressure value with high accuracy from a detected temperature and suppress control response delay.

Solution to Problem

A heat source-side heat exchanger fan control method pertaining to a first aspect of the present invention is a method of controlling a heat source-side heat exchanger fan that blows air to a heat source-side heat exchanger that performs heat exchange with refrigerant compressed in a compressor, the method comprising a first converting step, a second converting step, and a fan speed determining step. In the first converting step, a current converted high pressure value at a current time of the refrigerant inside a high pressure-side pipe of the compressor is obtained by converting from a current detected temperature at the current time of a temperature detector attached to the heat source-side heat exchanger. In the second converting step, a past converted high pressure value at a past time of the refrigerant inside the high pressure-side pipe is obtained by converting from a past detected temperature that the temperature detector detected at the past time before the current time. In the fan speed determining step, a corrected converted high pressure value is found by correcting the current converted high pressure value with the past converted high pressure value, and the speed of the heat source-side heat exchanger fan is determined using the corrected converted high pressure value.

According to the method pertaining to the first aspect, the speed of the heat source-side heat exchanger fan is determined using the corrected converted high pressure value and without using the current converted high pressure value like conventionally. For that reason, the speed can be determined in quick response to the actual high pressure value compared to the case of determining the speed of the heat source-side heat exchanger fan using the current converted high pressure value.

A heat source-side heat exchanger fan control method pertaining to a second aspect of the present invention is the method pertaining to the first aspect, wherein in the fan speed determining step, the corrected converted high pressure value is obtained by finding a rate of change of the current converted high pressure value in the neighborhood of the current time from the current converted high pressure value and the past converted high pressure value and adding the product of the rate of change and a correction coefficient to the current converted high pressure value.

According to the method pertaining to the second aspect, the speed can be determined by obtaining the converted high pressure value whose accuracy is high compared to conventionally by the simple operation of adding the product of the rate of change and the correction coefficient to the current converted high pressure value, so an improvement in the accuracy of the determination of the speed of the heat source-side heat exchanger fan is achieved simply.

A heat source-side heat exchanger fan control method pertaining to a third aspect of the present invention is the method pertaining to the second aspect, wherein in the fan speed determining step, the rate of change is found by dividing the difference between the current converted high pressure value and the past converted high pressure value by an amount of elapsed time from the past time to the current time.

According to the method pertaining to the third aspect, the rate of change is found simply with a simple operation using the few pieces of information of the current converted high pressure value, the past converted high pressure value, the past time, and the current time or the amount of elapsed time, so the configuration for executing the fan speed determining step becomes simple and the corrected converted high pressure value can be found quickly.

A heat source-side heat exchanger fan control method pertaining to a fourth aspect of the present invention is the method pertaining to the third aspect, wherein in the fan speed determining step, the amount of elapsed time is set to a constant value in the range of 2 seconds to 10 seconds.

According to the method pertaining to the fourth aspect, in the fan speed determining step, the determination of the speed is repeated at an appropriate time of 2 seconds to 10 seconds, which is relatively short, so even transient fluctuations in the high pressure value can be sufficiently handled.

A heat source-side heat exchanger fan control method pertaining to a fifth aspect of the present invention is the method pertaining to any of the first aspect to the fourth aspect and further comprises an outdoor temperature discriminating step. In the outdoor temperature discriminating step, the outdoor temperature of outdoor air that is the air-blowing target of the heat source-side heat exchanger fan is detected, and a discrimination of whether the outdoor temperature is in a first temperature region or a second temperature region higher than the first temperature region is performed. Additionally, in the fan speed determining step, when it has been discriminated in the outdoor temperature discriminating step that the outdoor temperature is in the first temperature region, the corrected converted high pressure value is used to determine the speed of the heat source-side heat exchanger fan, and when it has been discriminated in the outdoor temperature discriminating step that the outdoor temperature is in the second temperature region, the current converted high pressure value is used instead of the corrected converted high pressure value, or another corrected converted high pressure value found using another correction coefficient differing from the correction coefficient is used, to determine the speed of the heat source-side heat exchanger fan.

According to the method pertaining to the fifth aspect, in the fan speed determining step, whether to use the corrected converted high pressure value or the current converted high pressure value for the high pressure value that determines the speed is chosen depending on whether the outdoor temperature is in the first temperature region or the second temperature region. Because of that, the way of estimating the high pressure value can be appropriately changed in accordance with the temperature region that the outdoor temperature enters.

A heat source-side heat exchanger fan control method pertaining to a sixth aspect of the present invention is the method pertaining to any of the first aspect to the fifth aspect, wherein in the fan speed determining step, the corrected converted high pressure value that is closer to the actual pressure than the current converted high pressure value is used to determine the speed of the heat source-side heat exchanger fan.

According to the method pertaining to the sixth aspect, the corrected converted high pressure value is closer to the actual high pressure value than the current converted high pressure value that has been used conventionally, so the speed can be determined in quick response to the actual high pressure value compared to the case of determining the speed of the heat source-side heat exchanger fan using the current converted high pressure value.

An air conditioner pertaining to a seventh aspect of the present invention comprises a compressor, a heat source-side heat exchanger, a heat source-side heat exchanger fan, a temperature detector, and a controller. The compressor compresses refrigerant and has a high pressure-side pipe for discharging the refrigerant that has reached a high pressure. The heat source-side heat exchanger is connected to the high pressure-side pipe of the compressor and performs heat exchange with the compressed refrigerant. The heat source-side heat exchanger fan performs air blowing with respect to the heat source-side heat exchanger. The temperature detector is attached to the heat source-side heat exchanger. The controller converts from a current detected temperature at a current time of the temperature detector to obtain a current converted high pressure value at the current time of the refrigerant inside the high pressure-side pipe of the compressor. The controller also converts from a past detected temperature that the temperature detector detected at a past time before the current time to obtain a past converted high pressure value at the past time of the refrigerant inside the high pressure-side pipe. Additionally, the controller finds a corrected converted high pressure value by correcting the current converted high pressure value with the past converted high pressure value and controls the heat source-side heat exchanger fan at a speed determined using the corrected converted high pressure value.

According to the apparatus pertaining to the seventh aspect, the controller finds the speed of the heat source-side heat exchanger fan using the corrected converted high pressure value and without using the current converted high pressure value like conventionally. For that reason, the speed can be determined in quick response to the actual high pressure value compared to the case of determining the speed of the heat source-side heat exchanger fan using the current converted high pressure value.

An air conditioner pertaining to an eighth aspect of the present invention is the air conditioner of the seventh aspect, wherein the controller controls the heat source-side heat exchanger fan at a speed determined using the corrected converted high pressure value that is closer to the actual pressure than the current converted high pressure value.

According to the air conditioner pertaining to the eighth aspect, the corrected converted high pressure value is closer to the actual high pressure value than the current corrected high pressure value that has been used conventionally, so the speed can be determined in quick response to the actual high pressure value compared to the case of determining the speed of the heat source-side heat exchanger fan using the current converted high pressure value.

Advantageous Effects of Invention

In the control methods pertaining to the first aspect and the sixth aspect of the present invention, even though the high pressure value is obtained using temperature detection in the first converting step and the second converting step, the determination of the speed of the heat source-side heat exchanger fan can be performed in the fan speed determining step using the converted high pressure value whose accuracy is high, so space saving and cost reduction are achieved, and control response delay can be suppressed to improve the reliability of a refrigeration circuit having the heat source-side heat exchanger and the compressor.

In the control method pertaining to the second aspect of the present invention, an improvement in the accuracy of the determination of the speed is achieved simply, and an improvement in the degree of reliability of a refrigeration circuit having the heat source-side heat exchanger and the compressor is achieved simply.

In the control method pertaining to the third aspect of the present invention, it becomes easier for control response delay to be controlled, and it becomes easier for space saving and cost reduction to be achieved.

In the control method pertaining to the fourth aspect of the present invention, transient fluctuations in the high pressure value can be handled sufficiently in the fan speed determining step, so control response delay can be further suppressed to further improve the reliability of a refrigeration circuit having the heat source-side heat exchanger and the compressor.

In the control method pertaining to the fifth aspect, variations in the estimation of the high pressure value corresponding to the outdoor temperature become abundant, and it becomes easier to handle a variety of changing situations of the high pressure value.

In the air conditioner pertaining to the seventh aspect and the eighth aspect of the present invention, even though the temperature detector is disposed to obtain the high pressure value, the determination of the speed of the heat source-side heat exchanger fan is performed in the controller using the converted high pressure value whose accuracy is high, so space saving and cost reduction are achieved, and control response delay can be suppressed to improve the reliability of a refrigeration circuit having the heat source-side heat exchanger and the compressor.

DESCRIPTION OF EMBODIMENTS

First Embodiment (1) Overview of Configuration of Air Conditioner

Figure 1:
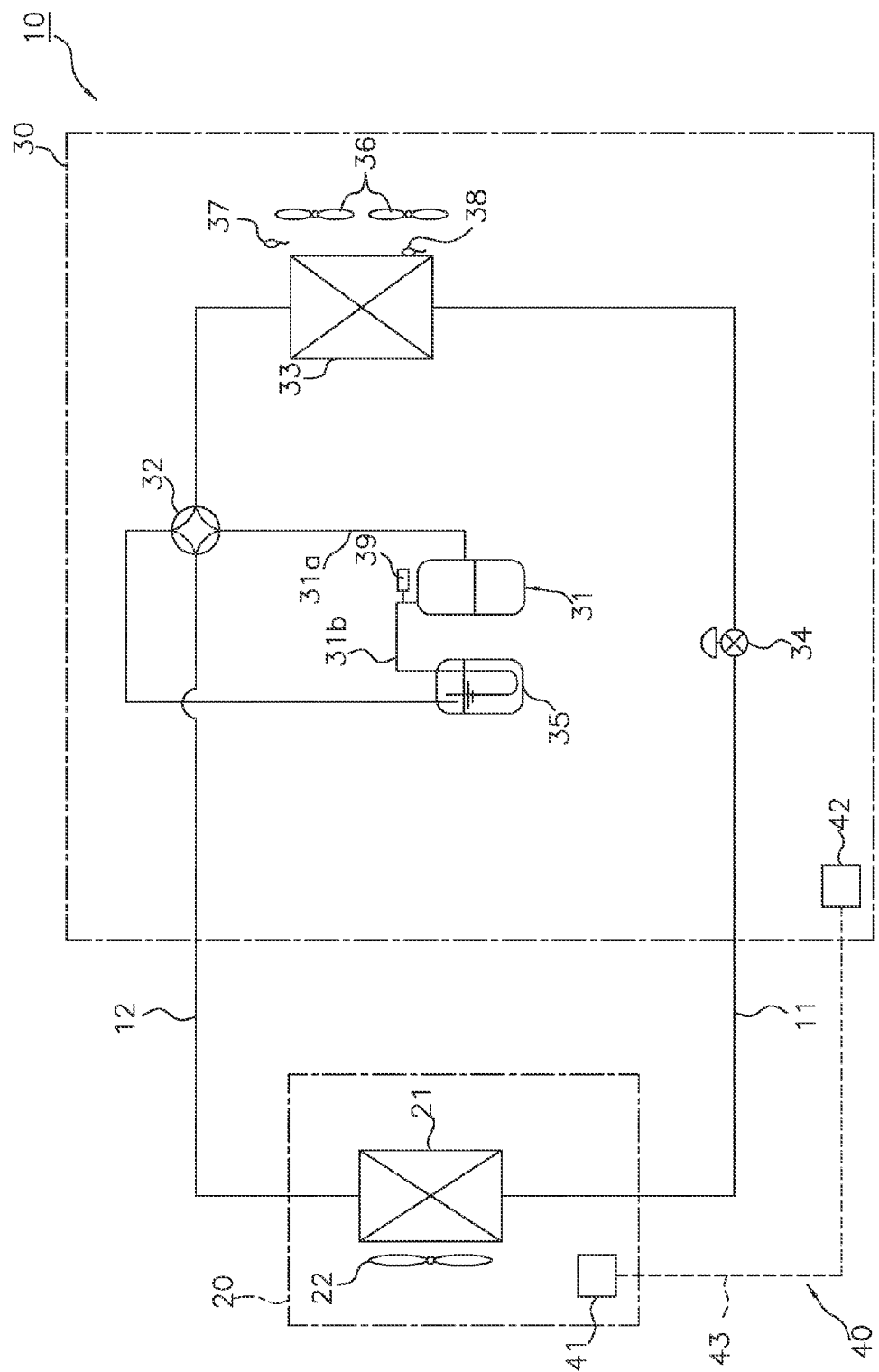
FIG. 1 is a diagram showing an overview of a configuration of an air conditioner pertaining to a first embodiment.

FIG. 1 shows an overview of an overall configuration of an air conditioner pertaining to a first embodiment of the present invention. An air conditioner 10 is configured as a result of an outdoor unit 30, which is a heat source unit, an indoor unit 20, which is a utilization unit, and others, being interconnected by connection pipes 11 and 12. The connection pipe 11 is a liquid refrigerant connection pipe that sends liquid refrigerant, and the connection pipe 12 is a gas refrigerant connection pipe that sends gas refrigerant. The transport of heat between the indoor unit 20 and the outdoor unit 30 is performed by the refrigerant flowing through these connection pipes 11 and 12.

The indoor unit 20 is equipped with an indoor heat exchanger 21 that causes heat exchange to be performed between indoor air and the refrigerant, an indoor fan 22 tier blowing the indoor air to the indoor heat exchanger 21, a variety of sensors (not shown in the drawings), an indoor controller 41, and so forth.

The outdoor unit 30 is equipped with a compressor 31, a four way valve 32, an outdoor heat exchanger 33, an expansion valve 34, an accumulator 35, an outdoor fan 36, an outdoor temperature sensor 37, an outdoor heat exchanger temperature sensor 38, a suction pressure sensor 39, an outdoor controller 42, and so forth.

The refrigerant circulates between the indoor heat exchanger 21 of the indoor unit 20 and the compressor 31, the four way valve 32, the outdoor heat exchanger 33, the expansion valve 34, and the accumulator 35 of the outdoor unit 30, and these configure a refrigeration circuit. In order to configure the refrigeration circuit, one side of the indoor heat exchanger 21 is connected to the expansion valve 34 via the connection pipe 11, and the other side of the indoor heat exchanger 21 is connected to the four way valve 32 via the connection pipe 12.

(2) Detailed Configuration (2-1) Outdoor Unit

The four way valve 32 of the outdoor unit 30 shown in FIG. 1 is for changing the connection of the refrigeration circuit during cooling and during heating and has first to fourth ports. A high pressure-side pipe 31a that extends from the discharge opening of the compressor 31 is connected to the first port of the four way valve 32. The outdoor heat exchanger 33 is connected to the second port of the four way valve 32. The third port of the four way valve 32 is connected to the connection pipe 12 and the refrigerant of the indoor heat exchanger 21 is flowed in and flowed out through the third port. Additionally, the fourth port of the four way valve 32 is connected to the accumulator 35 and the refrigerant returned to the compressor 31 is flowed out from the fourth port. Additionally a low pressure-side pipe 31b that extends from the suction opening of the compressor 31 is connected to the accumulator 35.

The outdoor fan 36 blows outdoor air to the outdoor heat exchanger 33. The air volume of the outdoor air that the outdoor fan 36 blows is controlled by the outdoor controller 42 by changing the speed of the fan motor that drives the outdoor fan 36. For that reason, the detection result of the outdoor heat exchanger temperature sensor 38 is input to the outdoor controller 42. The outdoor temperature sensor 37 is also connected to the outdoor controller 42. The outdoor controller 42 is connected to the indoor controller 41 by a signal line 43, and the indoor controller 41 and the outdoor controller 42 configure a controller 40.

(2-2) Overview of Actions of Indoor Unit and Outdoor Unit

During cooling, the refrigerant that has been compressed in the compressor 31 is supplied to the outdoor heat exchanger 33 connected to the second port. During cooling, the outdoor heat exchanger 33 works as a condenser. The refrigerant that has been evaporated in the outdoor heat exchanger 33 is expanded in the expansion valve 34 and is supplied to the indoor heat exchanger 21 via the connection pipe 11. The refrigerant that has obtained heat in the indoor heat exchanger 21 travels through the connection pipe 12 and is sent from the third port of the four way valve 32 via the fourth port to the accumulator 35.

During heating, the refrigerant that has been compressed in the compressor 31 is supplied to the indoor heat exchanger 21 via the third port. The refrigerant that has given off heat and cooled in the indoor heat exchanger 21 is sent from the indoor heat exchanger 21 via the connection pipe 11 to the expansion valve 34. The refrigerant that has been expanded in the expansion valve 34 is sent to the outdoor heat exchanger 33 and has obtained heat by heat exchange with the outdoor air in the outdoor heat exchanger 33. During heating, the outdoor heat exchanger 33 works as an evaporator. The refrigerant that has obtained heat in the outdoor heat exchanger 33 is sent from the second port of the four way valve 32 via the fourth port to the accumulator 35.

(2-3) Control System of Air Conditioner

Figure 2:
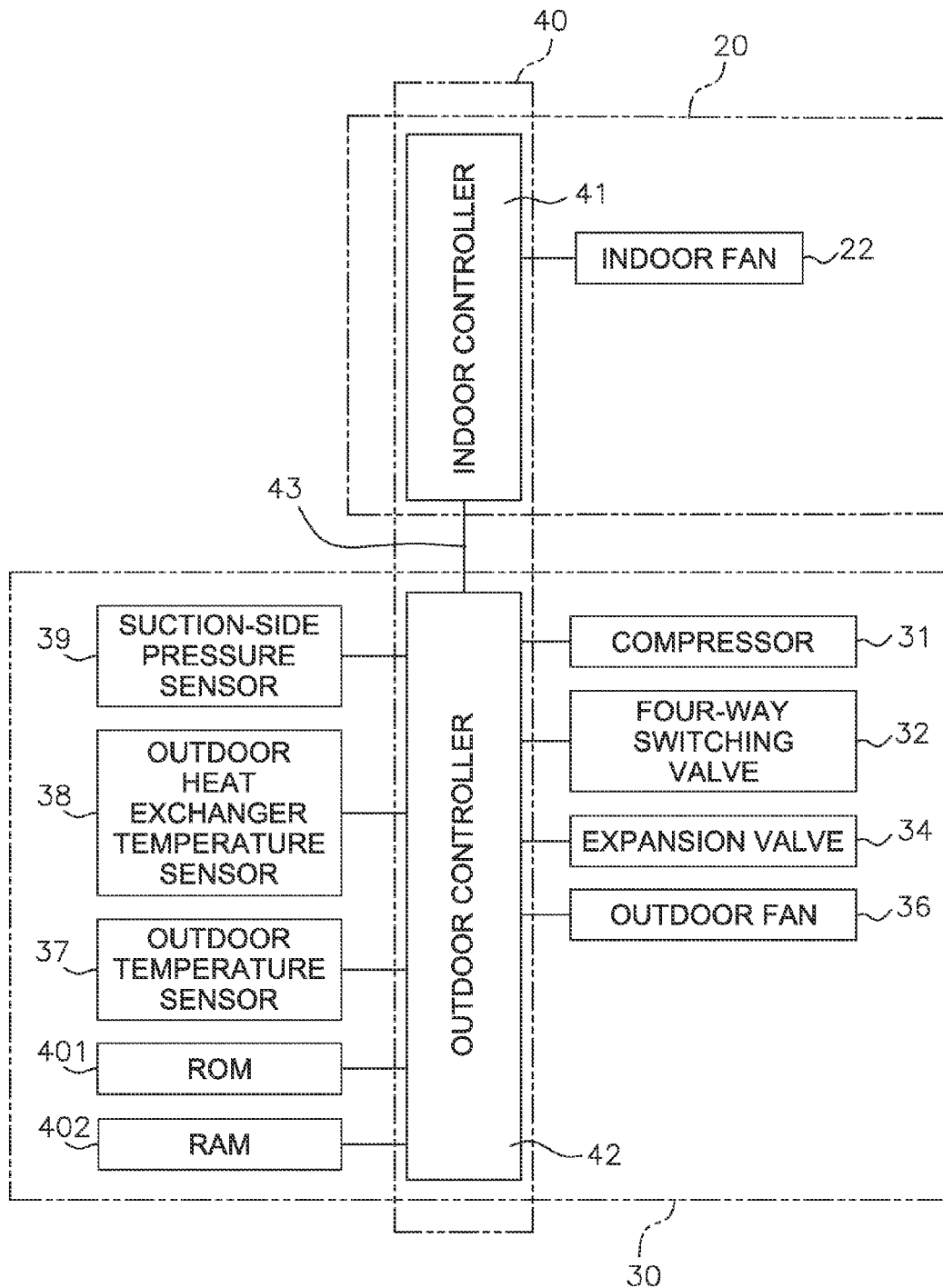
FIG. 2 is a block diagram for describing control of a controller of the air conditioner of FIG. 1.

FIG. 2 is a block diagram for describing a configuration of a control system of the air conditioner according to the first embodiment. As has already been described, the controller 40 includes the indoor controller 41 and the outdoor controller 42, is configured by a microprocessor including a CPU and so forth, and is connected to a ROM (Read-only Memory) 401, a RAM (Random Access Memory) 402 and others. An operation control program and various parameters are stored in the ROM 401. The RAM 402t temporarily stores work variables and so forth. The indoor controller 41 of the controller 40 is connected to the devices of the indoor unit 20 and has the function of controlling the actions of the indoor unit 20. The outdoor controller 42 of the controller 40 is connected to the devices of the outdoor unit 30 and has the function of controlling the actions of the outdoor unit 30.

In addition to the devices for configuring the refrigeration circuit, such as the compressor 31, the four way valve 32, and the expansion valve 34, the devices to which the outdoor controller 42 is connected include the outdoor fan 36 and sensors such as the outdoor temperature sensor 37, the outdoor heat exchanger temperature sensor 38, and the suction pressure sensor 39.

The outdoor temperature sensor 37 detects the temperature of the outdoor air sucked into the outdoor unit 30, and the outdoor heat exchanger temperature sensor 38 detects the temperature of the outdoor heat exchanger 33. Further, the suction pressure sensor 39 is mounted on the low pressure-side pipe 31b of the compressor 31 and detects the pressure of the refrigerant sucked into the compressor 31.

The capacity of the compressor 31 is controlled by the outdoor controller 42 by regulating the output frequency of an inverter circuit for driving the motor of the compressor 31. Generally, if there is a demand for a high cooling/heating capacity, the outdoor controller 42 raises the output frequency to increase the discharge quantity of the compressor 31, and if the cooling/heating capacity demand is low, the outdoor controller 42 lowers the output frequency to decrease the discharge quantity.

The outdoor controller 42 performs control that changes the connection of the four way valve 32 in order to perform switching between the cooling operation and the heating operation. As described above, during cooling, the outdoor controller 42 interconnects the first port and the second port of the four way valve 32 and interconnects the third port and the fourth port. Further, during heating, the outdoor controller 42 interconnects the first port and the third port of the four way valve 32 and interconnects the second port and the fourth port.

In the outdoor heat exchanger 33 also, it is possible for the capacity to be controlled by controlling the heat exchange quantity. The outdoor controller 42 controls the speed of the outdoor fan 36 in order to control the heat exchange quantity in the outdoor heat exchanger 33. Generally, when the outdoor controller 42 lowers the speed of the outdoor fan 36, the air volume of the outdoor air sent to the outdoor heat exchanger 33 decreases and the heat exchange quantity decreases. The speed of the outdoor fan 36 is switched in stages by the outdoor controller 42. 0th tap is a stopped state of the outdoor fan 36, and the air volume becomes larger in stages as the number of the tap becomes greater in order from 1st tap.

During a cooling operation under a low outside air temperature condition in which the air conditioner performs the cooling operation when the outside air temperature is low, there is the potential for the high-low pressure difference, which is the difference between the pressure of the refrigerant that the compressor 31 discharges and the pressure of the refrigerant that the compressor 31 sucks, to become lower than the proper value for the compressor 31. For this reason, in the cooling operation under the low outside air temperature condition, a condition that ensures the allowed high-low pressure difference for the compressor 31 is given priority even in a situation where the speed of the outdoor fan 36 should be raised in accordance with the cooling capacity demand. At this time, the outdoor controller 42 calculates the high-low pressure difference from the difference between a low pressure value of the refrigerant that the suction pressure sensor 39 detects and a converted high pressure value that has been converted on the basis of the temperature of the outdoor heat exchanger 33 that the outdoor heat exchanger temperature sensor 38 detects. Expressing this calculation with an equation results in $PD=PH-PL=f(T)-PL$ where PD represents the estimated high-low pressure difference, PL represents the low pressure value, PH represents the high pressure value, and $PH=f(T)$ represents the relationship between the converted high pressure value PH and the temperature T. Here, $f(T)$ is a function of temperature T.

Further, the outdoor controller 42 performs regulation of the opening degree of the expansion valve 34. Because of this opening degree regulation, the refrigerant that has left the indoor heat exchanger 21 becomes superheated.

(3) Outdoor Fan Control Method

Here, control of the outdoor fan in the cooling operation under the low outside air temperature condition will be described. The cooling operation is a cooling operation in a case where the outside air temperature is low, but it is not the case that the outside air temperature at the boundary between the cooling operation under the low outside air temperature condition and the normal cooling operation is set; rather, it varies depending on the devices and their installation situations. However, oftentimes any temperature lower than 20° C. is chosen to be the outside air temperature at the boundary, and oftentimes 0° C., which is the temperature at which water freezes, is chosen.

Particularly in the cooling operation under the low outside air temperature condition, the high-low pressure difference becomes smaller as has already been described, on accurately performing control of the speed of the outdoor fan 36 is required because it is necessary to secure the allowable high-low pressure difference. The speed of the outdoor fan 36 is determined in accordance with the estimated high-low pressure difference PD calculated by the outdoor controller 42. For that reason, the outdoor controller 42 converts the temperature of the outdoor heat exchanger 33 that the outdoor heat exchanger temperature sensor 38 has detected into the pressure (high pressure value) of the refrigerant in the high pressure-side pipe 31a of the compressor 31. At this time, fp(T) is a function that has conventionally come to be used for the conversion. Additionally, Tn represents the current temperature of the outdoor heat exchanger 33, To represents the past (previously detected) temperature, and the current time tn and the past time to represent the times when those have been detected.

So, the converted high pressure value f(T) that the outdoor controller 42 performs becomes: $f(T)=fp(Tn)+\alpha \times \{fp(Tn)-fp(To)\} \div (tn-to)\}$. Here, $\alpha$ is a correction coefficient (a constant) and is a value that has been predetermined by measurement for each actual product refrigerant circuit.

Moreover, if a differential coefficient is used to generalize a little more and express the above equation, the above equation becomes: $f(T)=fp(Tn)+\alpha \times dfp(Tn)/dt$. That is, if the inclination is known in regard to the change of the current temperature Tn with respect to time when the current temperature Tn has been detected, the converted high pressure value can be obtained even with another method.

The outdoor controller 42 uses the high pressure converted value f(T) to calculate the estimated high-low pressure difference PD and controls the speed of the outdoor fan 36 in accordance with the estimated high-low pressure difference PD.

Figure 3:
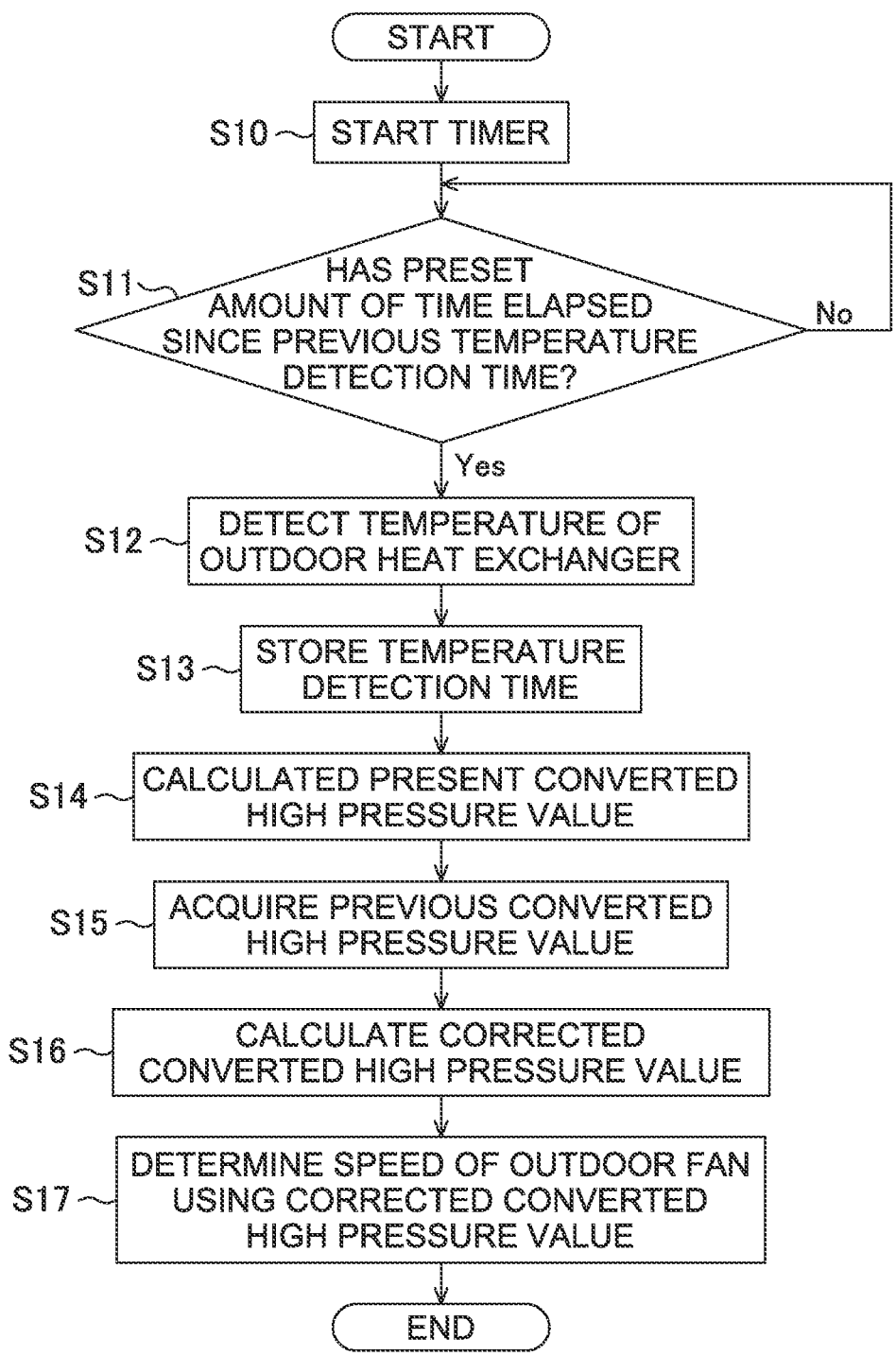
FIG. 3 is a flowchart showing an outdoor fan speed determination procedure according to the first embodiment.

The calculation of the high pressure value for controlling the speed of the outdoor fan in the cooling operation under the low outside air temperature condition is as follows when described in accordance with the flowchart shown in FIG. 3. In the outdoor controller 42, a program for controlling the speed of the outdoor fan 36 is read from the ROM 402. A timer built into the outdoor controller 42 starts when this program is executed. The timing at which the timer is started or at which the timer starts counting a predetermined amount of time is the time when operation starts or the time when the temperature was detected the previous time. For example, the outdoor controller 42 performs the conversion of the high pressure value at a ratio if 1 time per 5 seconds to calculate the high-low pressure difference, so in step S11 the outdoor controller 42 discriminates whether or not the preset amount of time (5 seconds) has elapsed. In step S11, the judgment is repeated until the preset amount of time elapses.

When the preset amount of time elapses, next, the outdoor controller 42 advances to step S12 where the temperature of the outdoor heat exchanger 33 is detected by the outdoor heat exchanger temperature sensor 38 and is transmitted to the outdoor controller 42. Moreover, the outdoor controller 42 advances to step S13 where it stores in the RAM 402 or the like the time at which the temperature was detected. Then, in the outdoor controller 42, the current converted high pressure value fp(Tn) is calculated using the detected temperature Tn (step S14).

Moreover, in step S15, the outdoor controller 42 acquires from the RAM 402 the previous (past) converted high pressure value fp(To). Then, the outdoor controller 42 obtains the corrected converted high pressure value f(T) using the current converted high pressure value fp(Tn) obtained in step S14 and the past converted high pressure value fp(To) obtained in step S15 (step S16).

The outdoor controller 42 calculates the estimated high-low pressure difference PD using the corrected converted high pressure value f(T) obtained in step S16 and the low pressure value detected by the suction pressure sensor 39. Moreover, the outdoor controller 42 uses this estimated high-low pressure difference PD that has been calculated to determine the speed of the outdoor fan 36 like conventionally in accordance with the program stored in the ROM 401 in such a way that the estimated high-low pressure difference PD does not become too small even in the cooling operation under the low outside air temperature condition.

Figure 4:
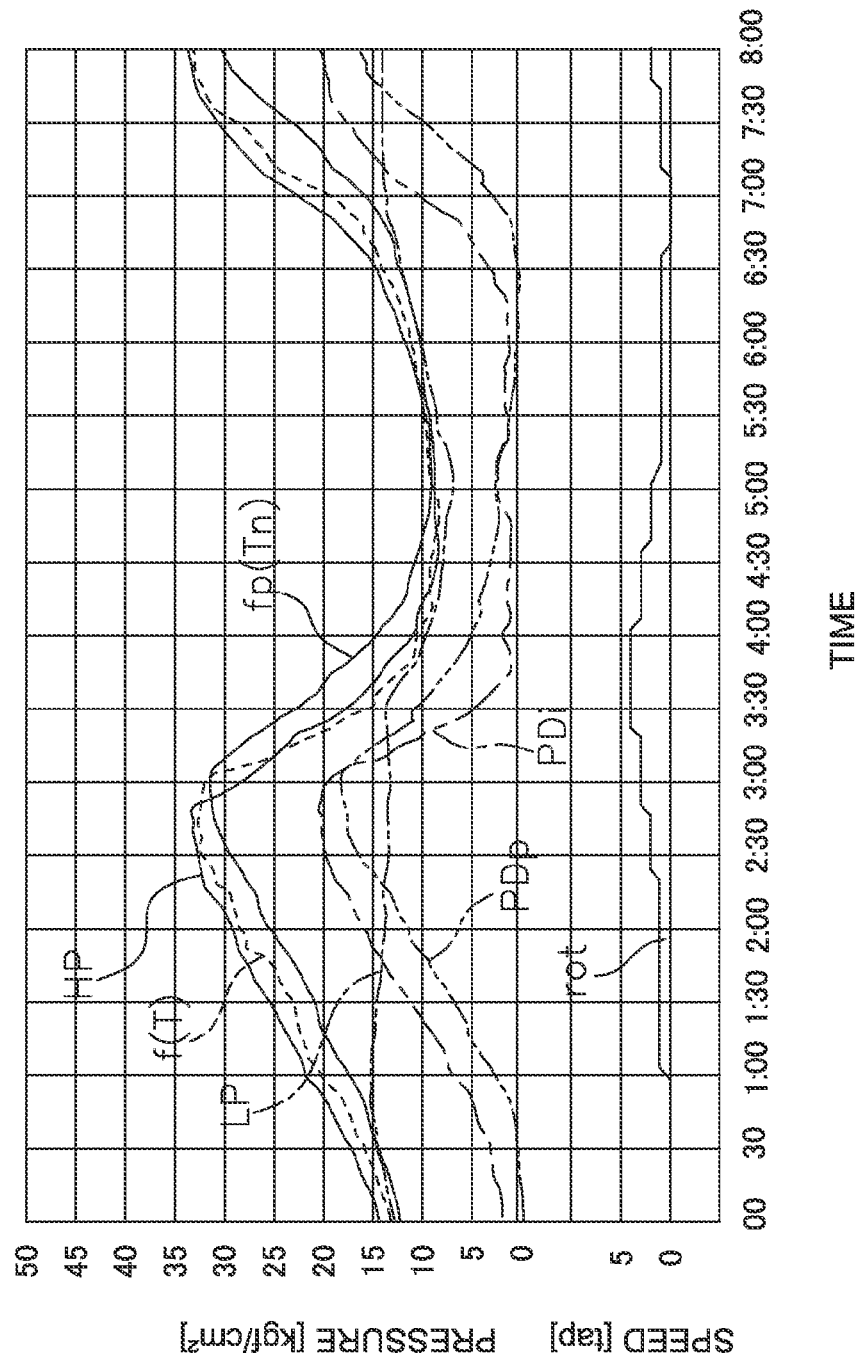
FIG. 4 is a graph showing example comparisons between converted high-pressure values and actual high-pressure values.

FIG. 4 is a graph for comparing estimated high-low pressure differences PDi calculated in accordance with the above-described procedure and estimated high-low pressure differences PDp calculated by the conventional method. In the graph of FIG. 4, the horizontal axis is a time scale and the vertical axis is the value scale of each characteristic value. In order to obtain detected high pressure value HP data, an experimental air conditioner in which a discharge-side pressure sensor is attached to the high pressure-side pipe 31a is used, and a diagram like FIG. 4 is created when the data obtained by the experimental air conditioner are used. In FIG. 4, detected low pressure values LP, detected high pressure values HP, corrected converted high pressure values f(T), conventional converted high pressure values fp(Tn), and a speed rot of the outdoor fan 36 determined on the basis of the estimated high-low pressure difference PDp are shown in addition to the estimated high-low pressure differences PDi and PDp. As for the speed rot, 0th tap is a stopped state and the speed rot increases in stages as the numerical value becomes larger. The detected low pressure value LP is the pressure of the refrigerant in the low pressure-side pipe 31b of the compressor 31 detected by the suction pressure sensor 39, and the detected high pressure value HP is the pressure of the refrigerant in the high pressure-side pipe 31a detected by the discharge-side pressure sensor.

In particular, whereas conventionally the outdoor fan 36 had stopped where it is not necessary to stop because of the estimated high-low pressure difference PDp in the vicinity of from 6 minutes 30 seconds to 7 minutes 0 second, in the high-low pressure difference PDi that has been calculated from the corrected converted high pressure value f(T), there is no such stopping of the outdoor fan 36, and control whose reliability is high is able to be performed.

(4) Characteristics (4-1)

The controller 40 of the air conditioner 10 pertaining to the first embodiment converts from the detected temperature Tn of the outdoor heat exchanger temperature sensor 38 (temperature detector) attached to the outdoor heat exchanger 33 (heat source-side heat exchanger), and the current converted high pressure value fp(Tn) of the refrigerant inside the high pressure-side pipe 31a of the compressor 31 is obtained (step S14 (first converting step)). Likewise, the past converted high pressure value fp(To) of the refrigerant inside the high pressure-side pipe 31a is obtained (step S15 (second converting step)). Then, the speed of the outdoor fan 36 (heat source-side heat exchanger fan) is determined by the controller 40 using the corrected converted high pressure value f(T) and without using the current converted high pressure value fp(Tn) like conventionally (step S17 (fan speed determining step)). For that reason, the corrected converted high pressure value f(T) is closer to the actual high pressure value HP than the current converted high pressure value fp(Tn) (see FIG. 4), so the speed can be determined in quick response to the actual high pressure value compared to the case of determining the speed of the outdoor fan 36 using the current converted high pressure value fp(Tn). Even though the high pressure value is obtained using the outdoor heat exchanger temperature sensor 38, the determination of the speed of the outdoor fan 36 is made using the converted high pressure value f(T) whose accuracy is high, so a discharge-side pressure sensor does not have to be used like conventionally, space saving and cost reduction are achieved, and control response delay can be suppressed with improving the reliability of the refrigeration circuit having the outdoor heat exchanger 33 and the compressor 31.

(4-2)

In step S17, the corrected converted high pressure value f(T) is obtained by finding a rate of change df(Tn)/dt of the current converted high pressure value in the neighborhood of the current time from the current converted high pressure value fp(Tn) and the past converted high pressure value fp(To) and adding the product of the rate of change dfp(Tn)/dt and the correction coefficient α to the current converted high pressure value fp(Tn). For that reason, the speed can be determined by obtaining the converted high pressure value f(T) whose accuracy is high compared to conventionally, so an improvement in the accuracy of the determination of the speed of the outdoor fan 36 is achieved simply, and an improvement in the degree of reliability of the refrigeration circuit having the outdoor heat exchanger 33 and the compressor 31 can be realized simply.

In particular, the rate of change dfp(Tn)/dt is found by dividing the difference between the current converted high pressure value fp(Tn) and the past converted high pressure value fp(To) by the amount of elapsed time (tn−to) from the past time to the current time, so the rate of change is found simply by a simple operation using a few pieces of information. Because of that, the configuration for executing step S17 becomes simple and the operation becomes fast, control response delay becomes easier to control, and it becomes easier to achieve space saving and cost reduction. In order to sufficiently handle even transient fluctuations in the high pressure value, it is preferred that the amount of elapsed time (tn−to) be set to a constant value in the range of 2 seconds to 10 seconds. Because of that, control response delay can be further suppressed to further improve the reliability of the refrigeration circuit having the outdoor heat exchanger 33 and the compressor 31.

(5) Modifications (5-1) Modification 1A

In the above-described embodiment, the rate of change dfp(Tn)/dt is found by dividing the difference between the current converted high pressure value fp(Tn) and the past converted high pressure value fp(To) by the amount of elapsed time (tn−to) from the past time to the current time, but the rate of change may also be found by another method. For example, the number of times that sampling for finding the rate of change is performed can also be increased, and the rate of change can also be found by differentiating with respect time by means of an analog circuit, so the method of finding the rate of change is not limited to the method of the above-described embodiment.

(5-2) Modification 1B

In the above-described embodiment, the rate of change is found and the correction is performed on the basis of the current converted high pressure value fp(Tn) and the past converted high pressure value fp(To), but the correction method is not limited to a method that adds the product of the rate of change and the correction coefficient. Another method can also be used as long as it is a method that corrects the advance or delay of the current converted high pressure value fp(Tn) in the appropriate direction by appropriately weighting and adding the current converted high pressure value fp(Tn) and the past converted high pressure value fp(To). For example, in the above-described embodiment, an example that uses one past converted high pressure value fp(To) was described, but several past converted high pressure values at different times may also be used.

Second Embodiment (1) Overview of Configuration

The configuration of the outdoor unit 30 according to a second embodiment is the same as that in the first embodiment. For that reason, description will be omitted in regard to the configuration of the air conditioner and the configuration of the outdoor unit of the second embodiment.

(2) Outdoor Fan Control Method

Figure 5:
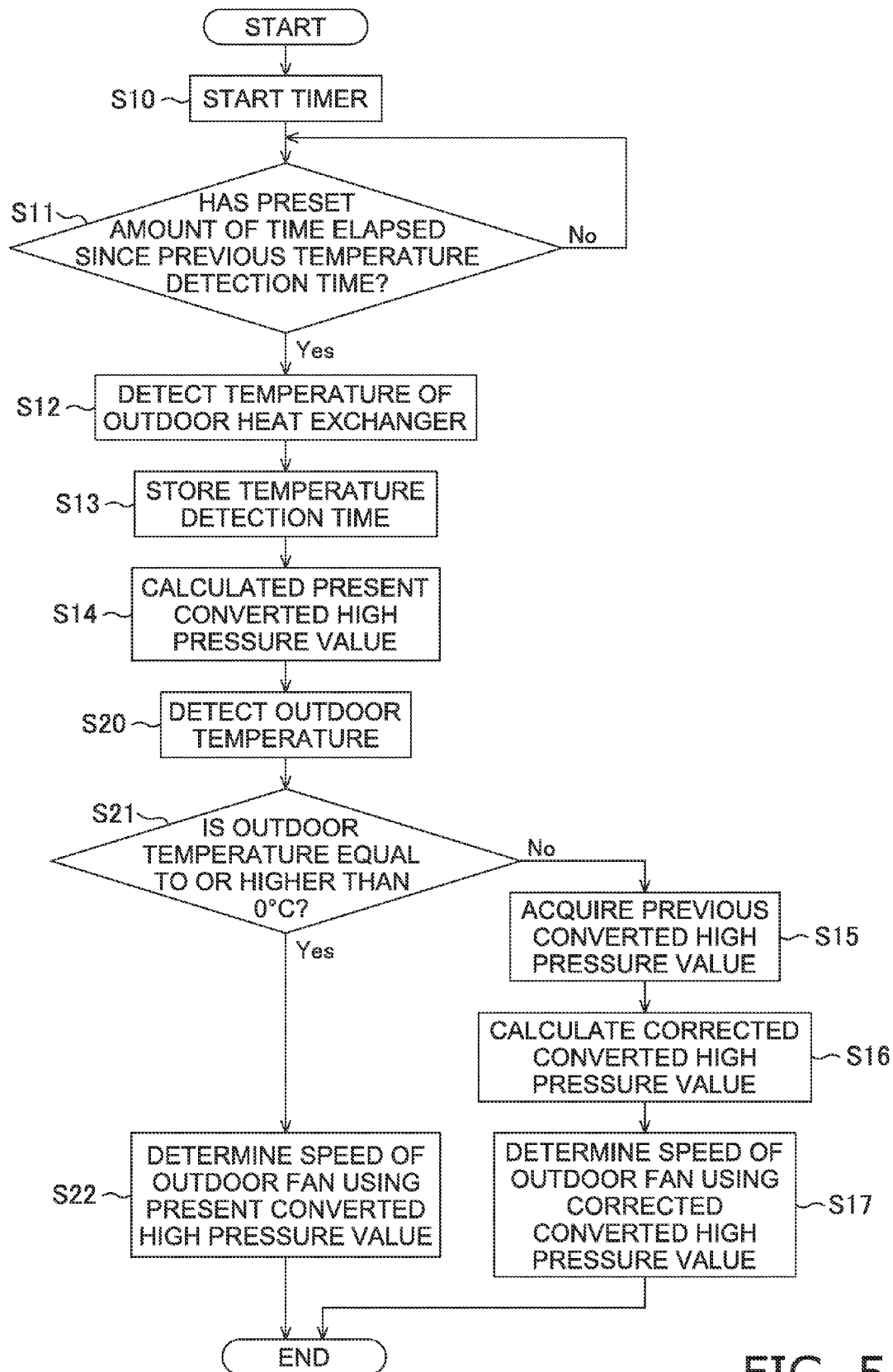
FIG. 5 is a flowchart showing an outdoor fan speed determination procedure according to a second embodiment.

Next, determination of the speed of the outdoor fan 36 will be described using FIG. 5. As will be understood by comparing FIG. 5 to FIG. 3, step S10 to step S14 are the same as those in the control of the speed of the outdoor fan of the first embodiment.

The control of the cooling operation under the low outside air temperature condition in the second embodiment differs from the control in the first embodiment beginning when the outdoor controller 42 receives the outdoor temperature from the outdoor temperature sensor 37 (step S20). The outdoor controller 42 judges whether or not the outdoor temperature is equal to or higher than 0° C. That is, in this case, the outdoor controller 42 judges a case where the outdoor temperature is lower than 0° C. as being the cooling operation under the low outside air temperature condition, and the speed of the outdoor fan 36 is determined through the process of steps S15 to S17 like in the first embodiment.

In a case where the outdoor temperature is equal to or higher than 0° C., this is not the cooling operation under the low outside air temperature condition, on like conventionally the outdoor controller 42 determines the speed of the outdoor fan 36 using the current converted high pressure value (step S22).

(3) Characteristics (3-1)

In the outdoor fan speed determination of the second embodiment, the outdoor temperature is detected (step S20) and a discrimination as to whether the outdoor temperature is in a temperature region (first temperature region) lower than 0° C., which is the temperature region of the cooling operation under the low outside air temperature condition, or a temperature region (second temperature region) equal to or higher than 0° C., which is the temperature region of the normal cooling operation, is performed (step S21 (outdoor air temperature discriminating step)).

In step S21, whether the corrected converted high pressure value f(T) is to be used or the current converted high pressure value fp(Tn) is to be used for the high pressure value that determines the speed is chosen depending on whether the outdoor temperature is lower than 0° C. or equal to or higher than 0° C., so the way of estimating the high pressure value can be appropriately changed in accordance with whether the outdoor temperature is equal to or higher than 0° C. or lower than 0° C. Because of that, two types of estimation variations can be decided between: when the outdoor temperature is equal to or higher than 0° C., the same reliability as conventionally is ensured by conventional handling, and in the cooling operation under the low outside air temperature condition in which the outdoor temperature is lower than 0° C., the high pressure value f(T) whose following response is good is used.

(4) Modifications (4-1) Modification 2A

In the above-described embodiment, a case was described where, as examples of the temperature regions, the temperature regions were divided using 0° C. as the boundary, but the temperature regions can also be divided by other temperatures or temperatures ranges.

(4-2) Modification 2B

In the above-described embodiment, in step S22 the same current converted high pressure value fp(Tn) as conventionally is used, but another estimated value may also be used. For example, as for using a corrected converted high pressure value also in step S22, a correction coefficient with a different value from the one in step S17 may be used.

What is claimed is:

1. A method of controlling a heat source-side heat exchanger fan blowing air to a heat source-side heat exchanger performing heat exchange with refrigerant compressed in a compressor, the method comprising:

converting a current detected temperature at a current time to obtain a current converted high pressure value at the current time, the current converted high pressure being a pressure of refrigerant inside a high pressure-side pipe of the compressor, and the current detected temperature being a temperature detected by a temperature detector attached to the heat source-side heat exchanger;

converting a past detected temperature detected by the temperature detector at a past time before the current time to obtain a past converted high pressure value at the past time, the past converted high pressure being a pressure of the refrigerant inside the high pressure-side pipe;

detecting an outdoor temperature of outdoor air that is an air-blowing target of the heat source-side heat exchanger fan; and determining whether the outdoor temperature is in a first temperature region or a second temperature region higher than the first temperature region, when the outdoor temperature is determined to be in the first temperature region, a corrected converted high pressure value being used to determine the speed of the heat source-side heat exchanger fan, the corrected converted high pressure value being obtained by obtaining a rate of change of the current converted high pressure value near the current time from the current converted high pressure value and the past converted high pressure value, and adding a product of the rate of change and a correction coefficient to the current converted high pressure value, and when the outdoor temperature is determined to be in the second temperature region, the current converted high pressure value being used instead of the corrected converted high pressure value to determine the speed of the heat source-side heat exchanger fan.

2. The heat source-side heat exchanger fan control method according to claim 1, wherein the rate of change of the current converted high pressure value is obtained by dividing a difference between the current converted high pressure value and the past converted high pressure value by an amount of elapsed time from the past time to the current time.

3. The heat source-side heat exchanger fan control method according to claim 2, wherein the amount of elapsed time is set to a constant value between 2 seconds and 10 seconds.

4. The heat source-side heat exchanger fan control method according to claim 1, wherein the corrected converted high pressure value closer to an actual pressure than the current converted high pressure value is used to determine the speed of the heat source-side heat exchanger fan.

* * * * *